(12) United States Patent
Holm et al.

(10) Patent No.: US 7,401,744 B2
(45) Date of Patent: Jul. 22, 2008

(54) JETTING DEVICE AND A METHOD OF JETTING DEVICE

(75) Inventors: William Holm, Älvsjö (SE); Kenth Nilsson, Åkersberga (SE); Johan Kronstedt, Sollentuna (SE); Mårten Lundberg, Hässelby (SE); Johan Berg, Uppsala (SE); Mikael Bergman, Järfälla (SE); Nicholas Glazer, Källby (SE)

(73) Assignee: Mydata Automation AB, Bromma (SE)

( * ) Notice: Subject to any disclaimer, the term of this patent is extended or adjusted under 35 U.S.C. 154(b) by 368 days.

(21) Appl. No.: 10/476,011

(22) PCT Filed: Apr. 25, 2002

(86) PCT No.: PCT/SE02/00807

§ 371 (c)(1),
(2), (4) Date: Feb. 12, 2004

(87) PCT Pub. No.: WO02/089545

PCT Pub. Date: Nov. 7, 2002

(65) Prior Publication Data
US 2004/0217193 A1   Nov. 4, 2004

(30) Foreign Application Priority Data
Apr. 27, 2001   (SE)   .................... 0101503

(51) Int. Cl.
B05B 17/00   (2006.01)
(52) U.S. Cl. ............... 239/1; 239/103; 239/104; 239/106; 239/112; 239/120; 239/121; 239/290; 239/296; 239/423; 134/21
(58) Field of Classification Search ............ 239/1, 239/103, 104, 105, 106, 112, 119, 120, 121, 239/122, 290, 423, 296; 134/21, 902; 222/148, 222/571
See application file for complete search history.

(56) References Cited

U.S. PATENT DOCUMENTS

| 4,004,733 | A | * | 1/1977 | Law ........................... 239/290 |
| 4,200,232 | A | * | 4/1980 | Fraley et al. ................. 239/112 |
| 4,857,367 | A | * | 8/1989 | Thorn et al. ................. 239/104 |
| 4,970,985 | A |   | 11/1990 | Slautterback |
| 5,048,454 | A | * | 9/1991 | Berntsson ................... 239/112 |
| 5,129,579 | A | * | 7/1992 | Conte ......................... 239/104 |
| 5,447,254 | A |   | 9/1995 | Hoover et al. |
| 5,756,155 | A |   | 5/1998 | Tzeng et al. |

(Continued)

FOREIGN PATENT DOCUMENTS

DE   197 57 797 A1   7/1999

(Continued)

Primary Examiner—Steven J. Ganey
(74) Attorney, Agent, or Firm—Birch, Stewart, Kolasch & Birch, LLP

(57) ABSTRACT

A jetting device and a method of jetting droplets of viscous medium onto a substrate. The jetting device includes a jetting outlet through which the droplets are jetted. The jetting device further includes a wall located at the jetting outlet, downstream of the jetting outlet seen in the jetting direction. The wall is provided with an orifice through which jetted droplets are permitted to pass through. A gaseous flow is provided within the space past the jetting outlet such that an adverse effect on the performance of the jetting device is prevented, the adverse effect resulting from the accumulation of viscous medium residue at the jetting outlet.

49 Claims, 8 Drawing Sheets

Figure 1:
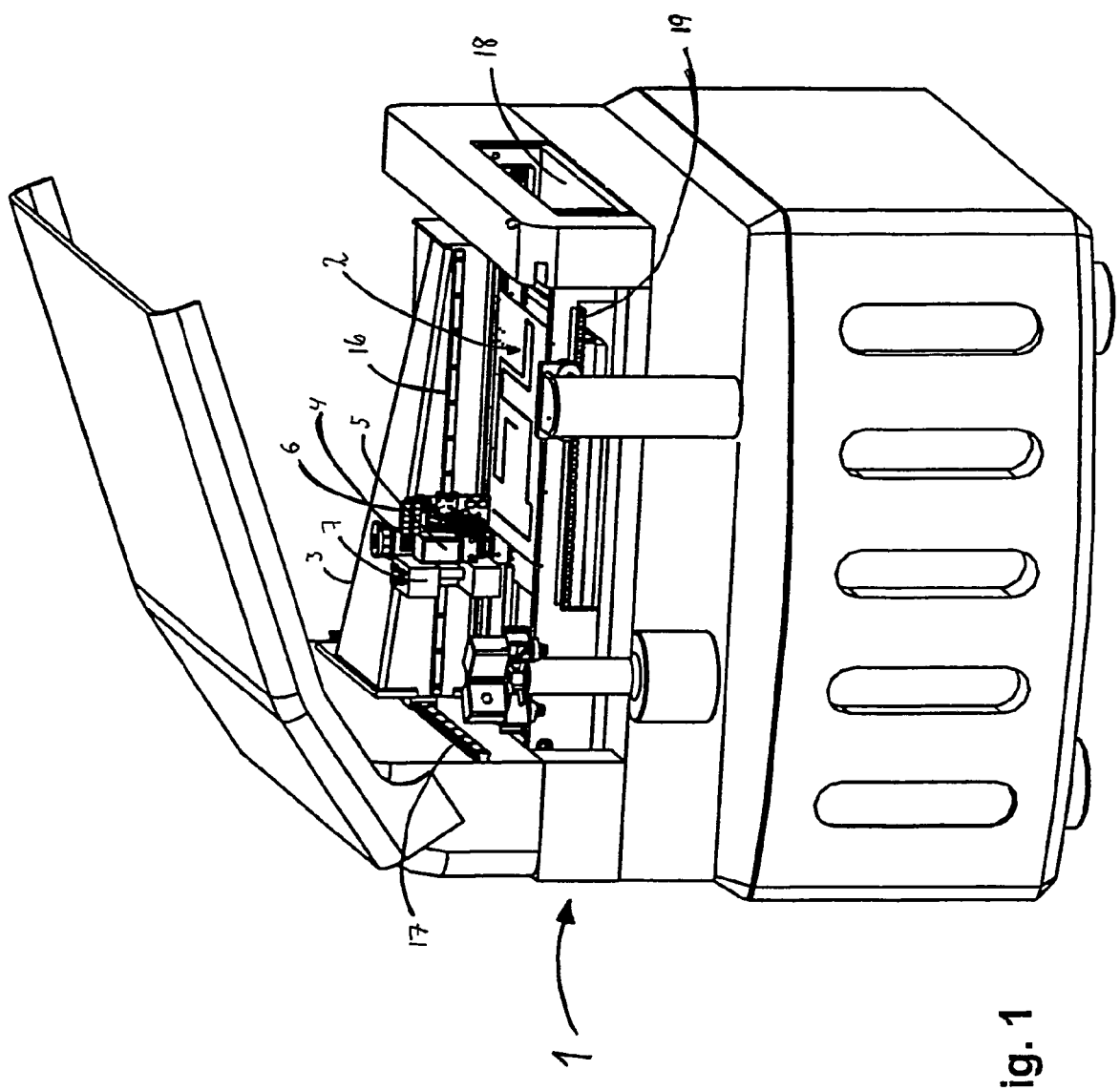

U.S. PATENT DOCUMENTS 5,988,526 A * 11/1999 Tzeng et al. ............... 239/119
6,270,019 B1    8/2001 Reighard
6,863,225 B2 *  3/2005 Nakamura ................. 239/105

FOREIGN PATENT DOCUMENTS

| | | |
|---|---|---|
| JP | 56 50664 | 9/1979 |
| JP | 4309460 | 11/1992 |
| JP | 5007815 | 1/1993 |
| JP | 6285412 | 10/1994 |
| JP | 11165098 | 6/1999 |
| JP | 2002301413 | 10/2002 |
| WO | WO 99/64167 A1 | 12/1999 |
| WO | WO-0062587 | 10/2000 |

* cited by examiner

JETTING DEVICE AND A METHOD OF JETTING DEVICE

This application is the national phase under 35 U.S.C. § 371 of PCT International Application No. PCT/SE02/00807 which has an International filing date of Apr. 25, 2002, which designated the United States of America, the entirety of which is hereby incorporated by reference.

TECHNICAL FIELD OF THE INVENTION

The present invention generally relates to the field of jetting droplets of a viscous medium onto a substrate. More specifically, the invention relates to a method of improving the performance of a jetting device, and a device for jetting droplets of viscous medium onto a substrate.

BACKGROUND OF THE INVENTION

Devices of the above mentioned kind are known and are primarily intended to be used for jetting droplets of viscous medium, e.g. solder paste or glue, onto a substrate, e.g. an electronic circuit board, prior to mounting of components thereon. An example of such a jetting device is disclosed in WO 99/64167. The jetting device comprises an eject chamber for containing a small volume of said medium prior to the jetting thereof, an eject nozzle communicating with the eject chamber, eject means for jetting said medium from the eject chamber through the eject nozzle, and supply means for feeding said medium into the eject chamber. In WO 00/62587 there is disclosed an assembly comprising such a jetting device.

The production speed is an essential factor in the manufacturing of electronic circuit boards. This has lead to a desire of increasing the speed at which a substrate is provided with viscous medium, a way of effecting this is to perform the actual jetting "on the fly", i.e. without stopping for each location on the substrate where viscous medium is to be deposited. A further way to improve the manufacturing speed of electronic circuit boards is to eliminate or reduce the need for operator interventions.

Both of these measures require good and reliable performance of the device used in the process, as well as a high degree of accuracy and a maintained high level of reproducibility during an extended period of time. The high quality requirements of the electronic industry and the detrimental consequences of errors appearing in circuit boards even further emphasise these requirements.

SUMMARY OF THE INVENTION

Thus, an object of the present invention is to improve the performance of a device for jetting droplets of viscous medium onto a substrate.

This and other objects are achieved according to the present invention by providing a method of jetting droplets of viscous medium onto a substrate and a device for jetting droplets of viscous medium onto a substrate.

According to a first aspect of the present invention, there is provided a method for jetting droplets of viscous medium onto a substrate, said jetting device comprising a jetting outlet through which said droplets are jetted, comprising the steps of providing a gaseous flow past the jetting outlet such that an adverse effect on the performance of the jetting device that may result from accumulation of viscous medium residue at the jetting outlet is prevented, providing a wall at the jetting outlet, said wall being located downstream of the jetting outlet seen in the jetting direction, and providing an orifice in said wall for permitting the jetted droplets to pass through the orifice, the orifice and the jetting outlet being aligned in the jetting direction.

According to a second aspect of the present invention, there is provided a method of jetting droplets of viscous medium onto a substrate, said jetting device comprising a jetting outlet through which said droplets are jetted, comprising the step of providing a gaseous flow past the jetting outlet such that an adverse effect on the performance of the jetting device that may result from accumulation of viscous medium residue at the jetting outlet is prevented, wherein the gaseous flow at the jetting outlet is directed along a flow path that intersects the jetting path of the jetted droplets.

According to a third aspect of the present invention, there is provided a method of jetting droplets of viscous medium onto a substrate, said jetting device comprising a jetting outlet through which said droplets are jetted, comprising the step of providing an air flow past the jetting outlet such that an adverse effect on the performance of the jetting device that may result from accumulation of viscous medium residue at the jetting outlet is prevented, wherein said air flow is provided through suction during, between and following the jetting of individual droplets.

According to a fourth aspect of the present invention, there is provided a device for jetting droplets of viscous medium onto a substrate, said device comprising a nozzle having a jetting outlet through which said droplets are jetted, a flow generator for producing a gaseous flow, a flow guide for providing a flow path for said gaseous flow past the jetting outlet, such that an adverse effect on the performance of the jetting device that may result from accumulation of viscous medium residue at the jetting outlet is prevented, wherein said flow guide comprises a wall located at the jetting outlet, said wall being located downstream of the jetting outlet seen in the jetting direction, said wall and said nozzle defining a first space there-between, and a first orifice provided in said wall, said first orifice and the jetting outlet being aligned along the path of the jetted droplets, said first orifice being designed to permit jetted droplets to pass through said first orifice essentially unaffected, wherein said flow guide is arranged to provide said gaseous flow within said first space along a flow path past the jetting outlet.

According to a fifth aspect of the present invention, there is provided a device for jetting droplets of viscous medium onto a substrate, said device comprising a nozzle having a jetting outlet through which said droplets are jetted, a flow generator for producing a gaseous flow, a flow guide for providing a flow path for said gaseous flow past the jetting outlet such that an adverse effect on the performance of the jetting device that may result from accumulation of viscous medium residue at the jetting outlet is prevented, said flow guide being arranged for providing said flow path in a direction that intersects the jetting path of the jetted droplets.

For the purposes of this application, it is to be noted that the term "viscous medium" should be interpreted as solder paste, flux, adhesive, conductive adhesive, or any other kind of medium used for fastening components on a substrate, conductive ink, resistive paste, or the like; and that the term "substrate" should be interpreted as a printed circuit board (PCB), a substrate for ball grid arrays (BGA), chip scale packages (CSP), quad flat packages (QFP), wafers, flip-chips, or the like.

It is also to be noted that the term "jetting" should be interpreted as a non-contact dispensing process that utilizes a fluid jet to form and shoot droplets of a viscous medium from a jet nozzle onto a substrate, as compared to a contact dispensing process, such as "fluid wetting", and that the term "gaseous flow" should be interpreted as a flow of air, compressed air, gas of any suitable type, such as nitrogen, or any other medium of a gaseous type.

Thus, the present invention relates to providing a gaseous flow at the jetting outlet of a jetting device for preventing an adverse effect on the performance of the jetting device that may result from accumulation of viscous medium residue at the jetting outlet.

As described above, a jetting device generally comprises an eject chamber communicating with a supply of viscous medium, and a nozzle communicating with the eject chamber. Prior to the jetting of a droplet, the eject chamber is supplied with viscous medium. Then, the volume of the eject chamber is rapidly reduced, causing a well-defined amount of viscous medium to be forced with high velocity out of the orifice or exit hole of the nozzle and onto a substrate, thus forming a deposit or dot of viscous medium on the substrate. The jetted amount is hereinafter referred to as a droplet or a jet.

During the actual jetting phase, the jetted viscous medium passes through the orifice of the nozzle and breaks off from the viscous medium remaining in the eject chamber, thus forming a droplet or jet travelling towards the substrate. During an instantaneous moment of the jetting phase, viscous medium passing the orifice is in contact with the orifice surrounding surfaces of the nozzle that are most adjacent to and facing the substrate, i.e. surfaces not being in contact with viscous medium between the jetting phases. The portion of the nozzle surrounding the orifice that is adjacent to and facing the substrate is hereinafter referred to as the "jetting outlet". Thus, the term "jetting outlet" does not include the portions of the nozzle facing the eject chamber, i.e. the portions being in contact with viscous medium between the jetting of droplets.

When jetting viscous medium, minute amounts of the medium tend to adhere or stick to the surfaces of the jetting outlet during the brief moment of contact between the surfaces and the viscous medium. This occurs due to the characteristics of the viscous medium. Since it is a requirement that the solder pastes or other viscous mediums adhere well to a substrate, a so called tackifier is often used when preparing the viscous medium in order to achieve the desired adhesiveness. As a consequence, viscous medium residue may remain attached or adhered to the surfaces of the jetting outlet following the jetting of a droplet. It should be noted that viscous medium residue refers to the undesired, often minute amounts of viscous medium that breaks off from the droplet during the jetting process. In this context, it refers to the amounts that has become attached to some surface of the jetting device after having been ejected out from the eject chamber.

According to the present invention, a gaseous flow is provided past the jetting outlet, the magnitude and the velocity of the gaseous flow being sufficient for transporting viscous medium residue away from the area at the jetting outlet with the gaseous flow. Thus, the often minute quantities of viscous medium that following the jetting of a droplet remains attached to surfaces at the jetting outlet where no residue is desired is loosened from said surface and carried away by the gaseous flow. Also, the gaseous flow provided past the jetting outlet may prevent certain quantities of viscous medium residue to attach to said surfaces in the first place.

As noted above, the presence of viscous medium residue, and the possible accumulation thereof, at the jetting outlet may have an adverse effect on the trajectory of the jetted droplets as they pass the jetting outlet. Also, the viscous medium residue may interfere with the jetted droplet so as to alter the volume of the droplet, e.g. a volume of viscous medium residue situated at the jetting outlet may loosen from the surface and instead adhere to and be incorporated into the jetted droplet. Furthermore, the residue may cause spattering of viscous medium when a jetted droplet "collides" with the residue. Consequently, the presence of viscous medium residue at the jetting outlet may cause deviations in the position, form or size of the resulting deposits compared to that intended. Also, there may be spatters of viscous medium on the substrate, which spatters may form solder balls that move around freely on the substrate during reflow and can, in turn, result in bridging, short circuits, and reduced reliability.

Thus, the accumulation or build-up of viscous medium residue has an undesired influence on the jetting performance and, consequently, on the overall performance of the jetting device. Particularly, the undesired presence of viscous medium residue at the jetting outlet will impair the accuracy and the reproducibility of the device, especially over a period of time, due to the random build-up of undesired material at the jetting outlet. It may also lead to inflicted undesired operator interventions, which brings about interruptions in the manufacturing process and thereby decreases the overall manufacturing speed.

Consequently, it is of great importance to prevent a negative effect on the jetting performance due to accumulation of viscous medium residue at the jetting outlet. In order to obtain a high manufacturing speed, it is essential that this negative effect can be prevented without interruptions in the manufacturing process. In order to achieve an effective jetting process it is desirable to provide the gaseous flow in a regulated way. For example, this can be achieved by providing the gaseous flow after the jetting of a series of droplets for removing and transporting away viscous medium residue from the surfaces of the jetting outlet. According to one example, such a series constitutes a predetermined number of jetted droplets. According to another example, the series is made up of the droplets jetted during a predetermined period of time. Preferably, the gaseous flow is provided according to a pre-programmed scheme, taken into account said series of jetted droplets, which scheme is controlled by some sort of control device.

Naturally, this can be combined, for example so that the gaseous flow is provided following a predetermined number of droplets, but within a predetermined maximum time period. This means that the gaseous flow is provided at specific intervals, unless the number of jetted droplets within such a time interval exceeds a threshold value. If so, there is provided a gaseous flow and the time interval and number of jetted droplets are reset. According to another preferred example, the gaseous flow is provided at each instant when there is no droplet jetted during a given period of time. At these predetermined "pauses", which can be the result of substrate exchange or any other reason, the gaseous flow is provided for removing viscous medium residue from the surfaces of the jetting outlet.

As an alternative to the predetermined or pre-programmed instances for providing the gaseous flow at the jetting outlet, the gaseous flow can be provided "on demand". Then, there is provided some sort of detector for detecting whether viscous medium residue has accumulated at the jetting outlet to such an extent that gaseous flow should be provided. The detector could be any suitable detector known within the art, such as a camera.

According to preferred embodiments of the invention, the gaseous flow is provided during the actual jetting of the droplets. Then, the gaseous flow is synchronised with the jetting periods, i.e. each time a droplet is jetted, there is provided a gaseous flow at the jetting outlet. Preferably, this is achieved by providing a continuous gaseous flow throughout the entire jetting procedure. Alternatively, the gaseous flow is paused at the time when, or at a predetermined time period after, the jetting process is halted.

The provision of a gaseous flow during the jetting of droplets provides a number of advantages. First, any viscous medium residue that has become attached to the jetting outlet surfaces following the jetting of a droplet is immediately transported from the vicinity of the jetting outlet. Second, the gaseous flow can pick up and transport away from the jetting outlet minute quantities of viscous medium that has broken off from the droplet or jet and that would otherwise adhere to the surfaces of the jetting outlet as residue. Thus, the build-up or accumulation of viscous medium residue at the jetting outlet to an adverse amount is prevented, whereby a high level of accuracy and reproducibility is maintained during a jetting period.

A further advantage resulting from the provision of gaseous flow during the actual jetting of a droplet is that satellites of viscous medium can be picked-up and transported away from the vicinity of the jetting outlet. Said satellites being minute quantities of viscous medium that undesirably breaks away from the droplet or jet of viscous medium during jetting, thus forming a so called satellite. Satellites do normally have the same general direction as the droplet or jet, although with an angular deviation that causes the satellites to hit the substrate spaced apart from the intended deposit. These satellites can cause the formation of solder balls that move around freely on the substrate during reflow and can, as stated above, result in bridging, short circuits, etc. Thus, the prevention of viscous medium satellites improves the result of the application of viscous medium onto the substrate and, hence, decreases the rejection rate of the completed substrates.

A still further advantage of providing gaseous flow at the jetting outlet during the jetting process is the possibility of obtaining a stabilizing effect on the trajectory of the jetted droplet. For example, according to an embodiment of the invention, the gaseous flow is provided towards the jetting outlet in a direction opposite that of the jetted droplet, i.e. axially directed along the jetting path. When reaching the jetting outlet, the flow is guided such that the flow away from the jetting outlet is radially directed. Preferably, the axially directed flow is essentially uniformly distributed, such that an essentially laminar flow is obtained that has a stabilizing effect on the trajectory or flight path of the jetted droplets or jets.

According to the present invention, the gaseous flow is generated through a flow generator. According to a preferred embodiment of the present invention, said flow generator is in the form of suction generator, i.e. in the form of a vacuum ejector or any other suitable type of suction generator. Said suction generator then being provided downstream of the area surrounding the jetting outlet, as seen in the direction of the gaseous flow.

An alternative way of producing the gaseous flow, according to another preferred embodiment of the present invention, is to provide blow generator, preferably in the form of a source of pressurised gas or any other suitable type of blow generator. The blow generator then, of course, being provided upstream of the area surrounding the jetting outlet. One advantage of providing a blow generator, as compared to a suction generator, is that a pressure difference of more than one atmosphere may be obtained.

According to a specific embodiment of the present invention a combination of a suction generator and a blow generator is provided for generating said gaseous flow. Then, the blow generator and suction generator are suitably provided on opposite sides of the jetting outlet.

According to preferred embodiments of the present invention, there is provided a guide for guiding the gaseous flow to and from the vicinity of, or the portion surrounding, the jetting outlet.

According to preferred embodiments of the invention, the gaseous flow is directed and focused or concentrated past the jetting outlet such that the flow velocity is increased to a level for optimising the transport of viscous medium residue from the surfaces of the jetting outlet, without adversely affecting the jetting process. This allows for an effective removal of viscous medium residue from the surfaces of the jetting outlet and decreases the possibility of viscous medium residue adhering to the jetting outlet surfaces, and thereby improves the accuracy and maintains a high degree of reproducibility during the jetting process. This can be achieved by providing a narrowed flow path past the jetting outlet.

According to embodiments of the first aspect of the present invention, the jetting device is provided with a wall, the wall being spaced apart from the jetting outlet and located downstream of the jetting outlet seen in the direction of the jetted droplets at the jetting outlet. Said wall may, as an example, constitute part of a nozzle support, but can be provided without having any supporting function for the nozzle. Between the wall and the jetting outlet, there is formed a space acting as a channel or guide for the gaseous flow at and past the jetting outlet.

According to a specific embodiment of the invention, the space formed between the jetting outlet and the wall acts as a channel for the gaseous flow. In this channel, one end of the space acts as an inlet, and the opposite end acts as an outlet for the gaseous flow, said ends being provided at opposite sides of the jetting outlet. Preferably, the end acting as an inlet communicates with a blow generator, and the end acting as an outlet communicates with a suction generator. Alternatively, only the blow generator or the suction generator, respectively, is provided. The communication between the space at the jetting outlet and said respective flow generator are preferably provided through channels, such that the flow generator can be provided at a distance from the jetting outlet.

Since said wall is located in the jetting path, the wall is provided with an opening or orifice, concentric with the jetting outlet. The jetted droplets are thereby permitted to pass through the wall via the orifice. According to a specific embodiment, the orifice of the wall also functions as an inlet for the gaseous flow towards the jetting outlet. An advantage of this embodiment is that a laminar flow can be provided in the manner described above, said laminar flow having a stabilizing effect on the trajectory of the jetted droplets or jets. Furthermore, in this embodiment, the jetted droplets will face a strong head wind immediately following the jetting thereof. Droplets having a jetting trajectory that deviates angularly from that intended, will encounter a slight side wind. The effect of the side wind on a jetted droplet will be dependent of the magnitude of the angular deviation. As a consequence, the angular deviation can be enhanced to such an extent that the jetted droplet will be collected by the wall.

Alternatively, one or more further orifices may be provided in said wall, said further orifice(s) then acting as an inlet for the gaseous flow towards the jetting outlet.

According to a further embodiment of the invention, including said wall and the orifice thereof through which the droplets are jetted, viscous medium satellites, produced during the jetting of droplets as described above, are prevented from reaching the substrate. This is achieved by providing said orifice with such dimensions that, whereas the jetted droplet is permitted to pass through the orifice, satellites having a direction that deviates from that of the jetted droplets miss the orifice and are collected by the wall.

In the embodiment where the orifice of the wall constitutes an inlet for the gaseous flow towards the jetting outlet, any satellites produced will in the same manner as described above, due to their angular deviation, encounter a side wind that enhances their angular deviation such that they may be collected by the wall. Due to the lower velocity and significantly smaller volume of the satellites, as compared to the viscous medium droplets, the satellites will be much more susceptible to the effects of the side wind.

As understood by the man skilled in the art, the gaseous flow may be provided such that any viscous medium, e.g. jetted droplets or satellites, collected by the wall is removed therefrom and transported away by the gaseous flow.

According to an example of the present invention, the focusing of the gaseous flow for optimizing or increasing the ability of the gaseous flow to transport viscous medium residue from the jetting outlet is obtained by providing the wall with a suitable design. According to one embodiment, the wall is provided with an annular protrusion at and surrounding the jetting outlet that decreases the area of the flow path and thereby increases the flow velocity past the jetting outlet. However, as realized by the man skilled in the art, a vast number of different designs are possible to obtain the desired increase in flow velocity and ability to transport viscous medium in accordance with the present invention.

Furthermore, the wall may be designed to minimize the surface area surrounding the orifice onto which viscous medium may possibly become attached. According to one exemplary embodiment, this is achieved by providing a bevelled surface around the orifice on the side of the wall facing the substrate. Then, the inward orifice surface facing the viscous medium droplet as the droplet passes the orifice may be significantly reduced, which would reduce the risk of viscous medium attaching to the wall surface and negatively affect the performance of the jetting device. Furthermore, providing a bevelled surface around the orifice will have the additional advantage of reducing the flow resistance into the orifice, thereby enabling a more efficient suction and a reduced risk of turbulence.

According to an alternative embodiment, the wall is provided with at least one channel for providing a flow path for the gas towards the jetting outlet. Then, said at least one channel has an extension within and along said wall, and is provided with at least one channel outlet at the orifice of the wall. Preferably, each channel exit or outlet is arranged such that the gaseous flow is directed at the jetting outlet. In this embodiment, the gaseous flow is preferably provided by a blower of some sort, preferably a source of pressurized gas in communication with the channel(s). This may of course be combined with a suction device, as understood by the man skilled in the art.

According to a further exemplifying embodiment of the invention, the jetting outlet and the wall are comprised in a single integral structure. Preferably, the integral structure is provided with a channel for providing a narrow flow path that intersects the path of the jetted droplets. Then, the term "jetting outlet" refers to the portion of the integral structure that faces the "upper" side of the flow path, i.e. the side of the flow path facing the eject chamber. As understood by the man skilled in the art, the wall can be of any suitable form or shape with an orifice, concentric with the jetting outlet, as described above.

According to preferred embodiments of the second aspect of the invention the gaseous flow is provided in a direction intersecting the path of the jetted droplets. According to a specific embodiment, the gaseous flow is directed essentially perpendicularly to the path of the jetted droplets. Preferably, the gaseous flow is provided past and sweeping along the surfaces of the jetting outlet.

It should be noted that according to embodiments of the second aspect of the present invention, for embodiments that utilize both a suction generator and a blow generator located on opposite sides of the jetting outlet, the provision of a wall of the type described in relation to the first aspect of the invention is not essential. Thus, there could be provided an open space between the jetting outlet and the substrate without omitting the possibility to provide a gaseous flow past the jetting outlet of sufficient amount and velocity to prevent an adverse effect on the performance of the jetting device from viscous medium residue at the jetting outlet.

According to preferred embodiments of the invention, there is provided a filter for collecting viscous medium transported from the vicinity of the jetting outlet by the gaseous flow. The filter is also provided for preventing viscous medium from ending up in the suction generator, for the embodiments where such is provided.

Furthermore, there may be provided a collection space where viscous medium transported by the gaseous flow is collected. Then, collected viscous medium can be collected from the collection space for reuse. Preferably, the collection space, or waste storage, is located before the filter, as seen in the direction of the gaseous flow.

The jetting device having the features of the present invention is preferably comprised in an assembly. Then, the flow generator is preferably located away from the jetting assembly, communicating with the assembly through a gas or pneumatic interface, which in turn communicate with the inlet through a guide, i.e. channels, provided in the assembly.

Further objects and advantages of the present invention will be discussed below by means of exemplifying embodiments.

BRIEF DESCRIPTION OF THE DRAWINGS

Preferred embodiments of the invention will be described below with reference to the accompanying drawings, in which:

FIG. 1 is a perspective view showing the general outline of a machine for application of solder paste comprising a jetting device according to the present invention;

FIG. 2 is a schematic view from above of an embodiment of a docking device and a jetting assembly of the present invention;

FIG. 3 is a schematic view showing the underside of the assembly shown in FIG. 2;

FIG. 4 is a sectional view of a first embodiment of the central portion of an assembly comprising a jetting device according to one embodiment of the present invention;

FIG. 5*a* is an alternative sectional view of the embodiment shown in FIG. 4, and FIGS. 5*b* and 5*c* are enlarged sectional views showing a portion thereof in greater detail;

FIG. 6*a* is a similar view as FIG. 5*a* illustrating an alternative embodiment of the central portion of the assembly, and FIG. 6*b* is an enlarged sectional view showing a portion thereof in greater detail; and FIG. 7 is an enlarged sectional view of an alternative embodiment of the device according to the invention.

DETAILED DECRIPTION OF EXEMPLIFYING EMBODIMENTS

FIG. 1 illustrates the general outline of a preferred embodiment of a machine 1 for providing a substrate 2 with deposits by dispensing droplets of a viscous medium onto the substrate 2, i.e. jetting, in accordance with the present invention. For ease of description, the viscous medium will hereinafter be referred to as solder paste, which is one of the alternatives defined above. For the same reason, the substrate will be referred to as an electric circuit board and the gas will be referred to as air. In this embodiment, the jetting machine 1 is of a type comprising an X-beam 3 and an X-wagon 4, which is connected to the X-beam 3 via an X-rail 16 and reciprocatingly movable along the X-rail 16. The X-beam, in turn, is reciprocatingly movably connected to a Y-rail 17, the X-beam 3 thereby being movable perpendicularly to the X-rail 16. The Y-rail 17 is rigidly mounted in the jetting machine 1. Generally, the movements are provided by linear motors (not shown).

Furthermore, the jetting machine 1 comprises a conveyor 18 for carrying the board 2 through the jetting machine 1, and a locking device 19 for locking the board 2 when jetting is to take place.

A docking device 8 is connected to the X-wagon 4 for enabling releasable mounting of an assembly 5 at the docking device 8. The assembly 5 is arranged for dispensing droplets of solder paste, i.e. jetting, which impact and form deposits on the board 2. The jetting machine 1 also comprises a vision device 7, which in this embodiment is a camera. The camera 7 is used for determining the position and rotation of the board 2 and for checking the result of the dispensing process by viewing the deposits on the board 2.

Additionally, the jetting machine 1 comprises a vacuum ejector 6 arranged on the X-wagon 4, and a source of compressed air (not shown). The vacuum ejector 6, as well as the source of compressed air, is in communication with the docking device 8 via an air conduit interface which are connectable to a complementary air conduit interface, in this embodiment indicated as input nipples 9, see FIG. 2, of the docking device 8.

As understood by those skilled in the art, the jetting machine comprises a control unit (not explicitly shown) for executing software running the machine.

Briefly, the jetting machine works as follows. The board 2 is fed into the jetting machine 1 by means of the conveyor 18, upon which the board 2 is placed. When the board 2 is in the correct position under the X-wagon 4, the board 2 is fixed with the aid of the locking device 19. By means of the camera 7, fiducial markers are located, which markers are prearranged on the surface of the board 2 and used to determine the precise position thereof. Then, by moving the X-wagon over the board 2 in a predetermined (pre-programmed) pattern and operating the jetting assembly 5 at predetermined locations, solder paste is applied on the board 2 at the desired locations.

Figure 2:
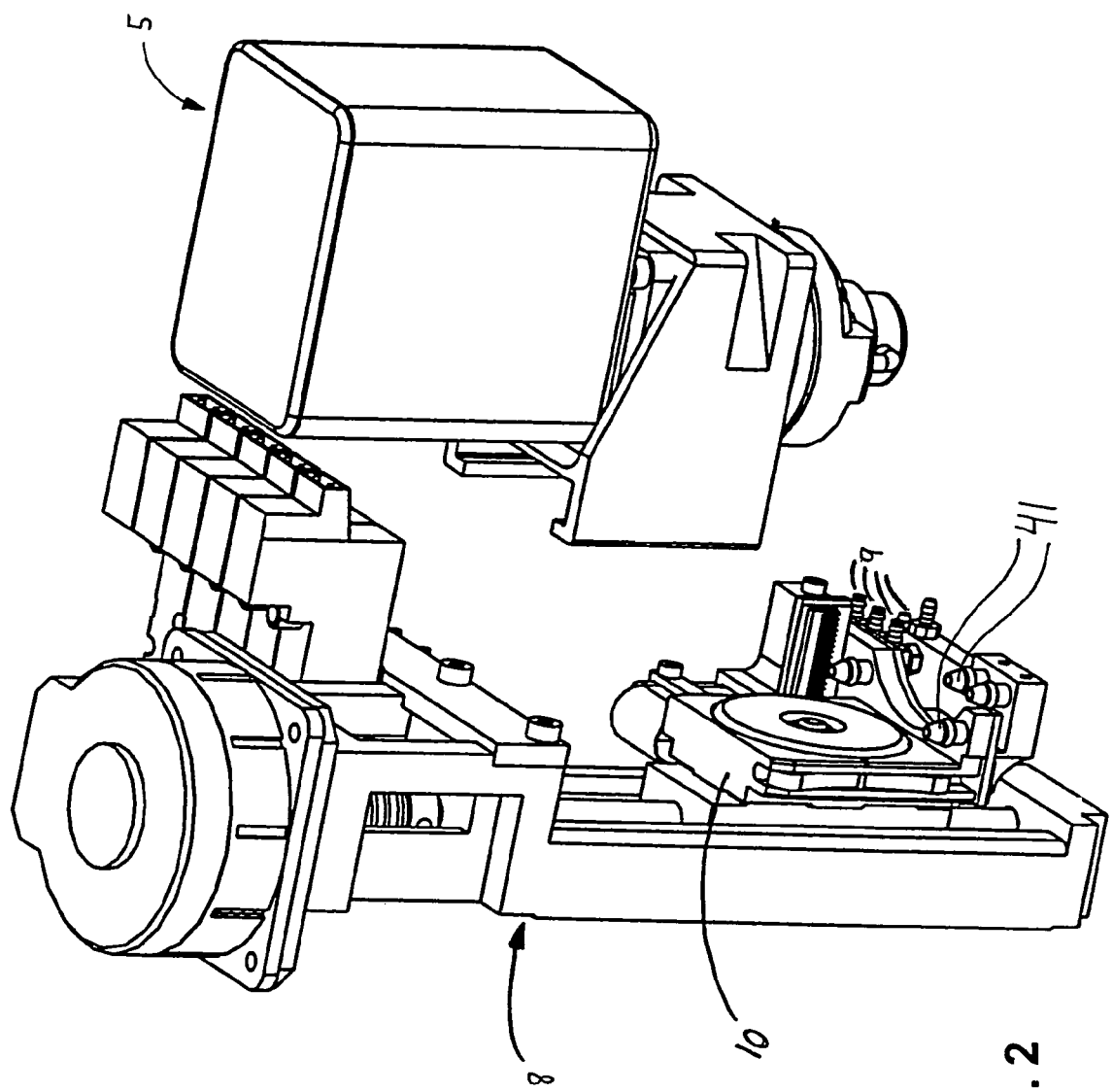
Figure 3:
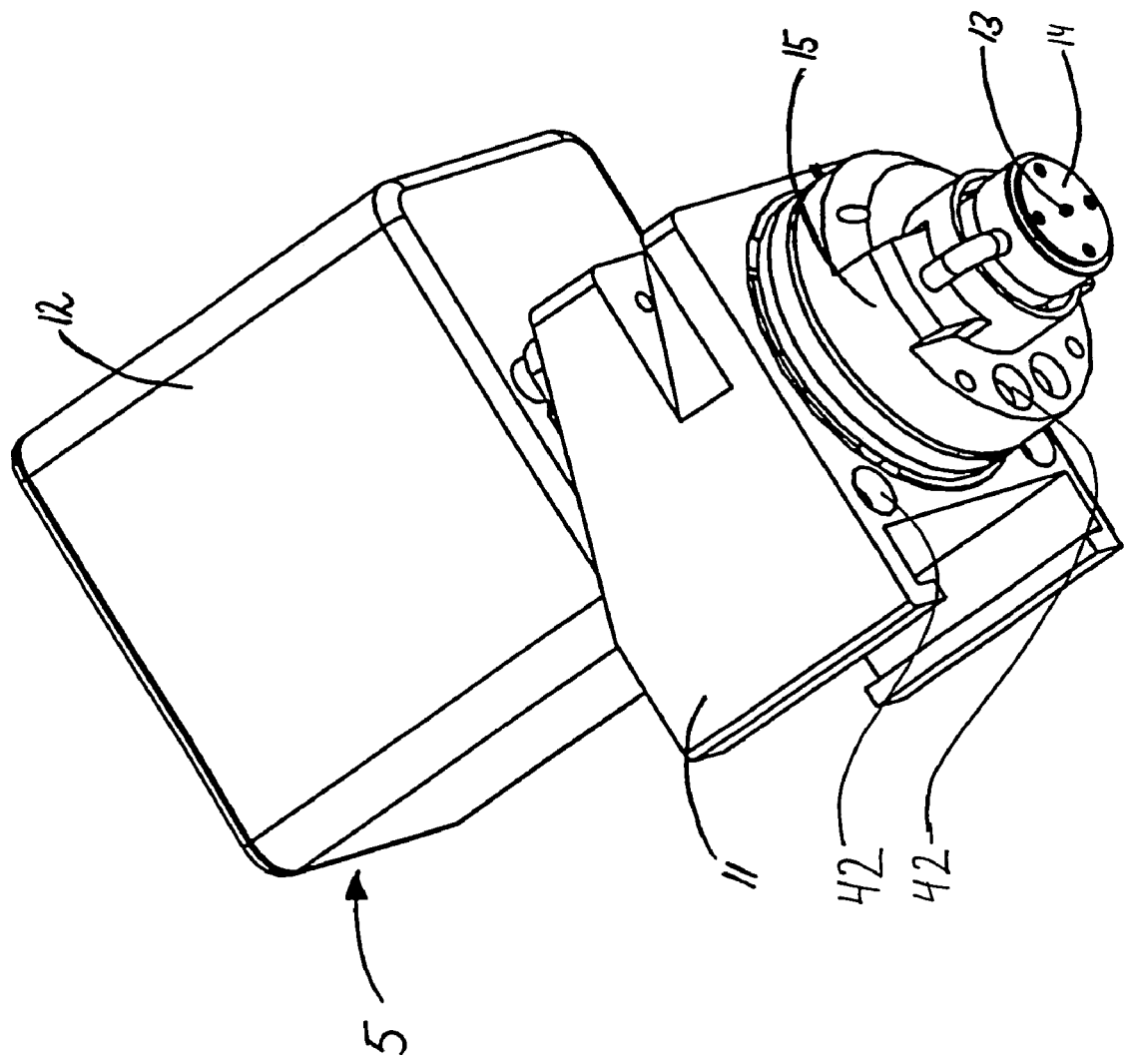

With reference to FIGS. 2-3, a preferred embodiment of the jetting assembly 5, in accordance with the present invention, will now be described in more detail. The jetting assembly comprises an assembly holder 11 for connecting the jetting assembly 5 to an assembly support 10 of the docking device, see FIG. 2. Further, in this embodiment the jetting assembly 5 comprises a supply container 12 providing a supply of solder paste, and an assembly housing 15. The jetting assembly 5 is connected to the vacuum ejector 6 and the source of pressurised air via a pneumatic interface comprising inlets 42, positioned to interface in airtight engagement with a complementary pneumatic interface comprising outlets 41, of the docking device 10.

With reference now to FIGS. 4-7, the contents and function of the device enclosed in the assembly housing will be explained in greater detail. As can be seen in these sectional views, the jetting assembly 5 includes a jetting device comprising an actuator locking screw 20 for supporting an actuator in the assembly housing 15, and a piezoelectric actuator 21 formed by a number of thin, piezoelectric elements stacked together to form an actuator 21, which is rigidly connected to the locking screw 20. The jetting device further comprises a bushing 25 rigidly connected to the assembly housing 15, and a plunger 23 rigidly connected to the end of the piezoelectric actuator 21, opposite the position of the locking screw 20. The plunger 23 is axially movable while slidably extending through a bore in the bushing 25. Cup springs 24 are provided to resiliently balance the plunger 23 against the assembly housing 15, and for providing a preload for the actuator 21. An eject control unit (not shown) applies a drive voltage intermittently to the piezoelectric actuator 21, thereby causing an intermittent extension thereof and hence a reciprocating movement of the plunger with respect to the assembly housing 15, in accordance with solder pattern printing data.

Further, the jetting device comprises an eject nozzle 26 operatively directed against the board 2, onto which small droplets of solder paste are to be jetted. In the nozzle 26, there is comprised a jetting orifice 27 through which the droplets are jetted. The surfaces of the nozzle 26 surrounding the jetting orifice 27 and facing the substrate 2 will be referred to as a jetting outlet. The plunger 23 comprises a piston portion which is slidably and axially movably extending through a piston bore 35, an end surface of said piston portion of the plunger 23 being arranged close to said nozzle 26. An eject chamber 28 is defined by the shape of the end surface of said plunger 23, the inner diameter of the bushing 25 and the nozzle orifice 27. Axial movement of the plunger 23 towards the nozzle 26, said movement being caused by the intermittent extension of the piezoelectric actuator 21, will cause a rapid decrease in the volume of the eject chamber 28 and thus a rapid pressurization and jetting through the nozzle orifice 27, of any solder paste contained in the eject chamber 28.

Solder paste is supplied to the chamber from the supply container 12, see FIG. 2, via a feeding device. The feeding device comprises an electric motor (not shown) having a motor shaft 29 partly provided in a tubular bore 30, which extends through the assembly housing 15 to an outlet 36 communicating via a tubular bore 31 with said piston bore 35. An end portion of the motor shaft 29 forms a rotatable feed screw 32 which is provided in, and coaxial with, the tubular bore 30. An essential portion of the rotatable feed screw 32 is surrounded by an array of resilient, elastomeric o-rings 33 arranged coaxially therewith in the tubular bore 30, the threads of the rotatable feed screw 32 making sliding contact with the innermost surface of the o-rings 33.

The pressurized air obtained from the above-mentioned source of pressurized air (not shown) is arranged to apply a pressure on the solder paste contained in the supply container 12, thereby feeding said solder paste to an inlet port 34 communicating with the tubular bore 30. An electronic control signal provided by a supply control unit (not shown) to the motor causes the motor shaft 29, and thus the rotatable feed screw 32, to rotate a desired angle, or at a desired rotational speed. Solder paste captured between the threads of the rotatable feed screw 32 and the inner surface of the o-rings 33 are then made to travel from the inlet port 34 to the piston bore 35 via the outlet port 36 and the tubular bore 31, in accordance with the rotational movement of the motor shaft 29. A sealing o-ring 22 is provided at the top of the piston bore 35 and the bushing 25, such that any solder paste fed towards the piston bore 35 is prevented from escaping from the piston bore 35 and possibly disturbing the action of the plunger 23.

The solder paste is then fed into the eject chamber 28 from an outlet port 36 of the tubular bore 30 via the conduit 31 and a channel 37. The channel 37 is provided in the piston portion of the plunger 23, wherein said channel 37 has a first portion extending axially into said plunger and communicating with the conduit 31, and a second portion extending coaxially with and within said plunger 23 from said first portion to the end surface of the plunger facing the eject chamber 28.

Figure 4:
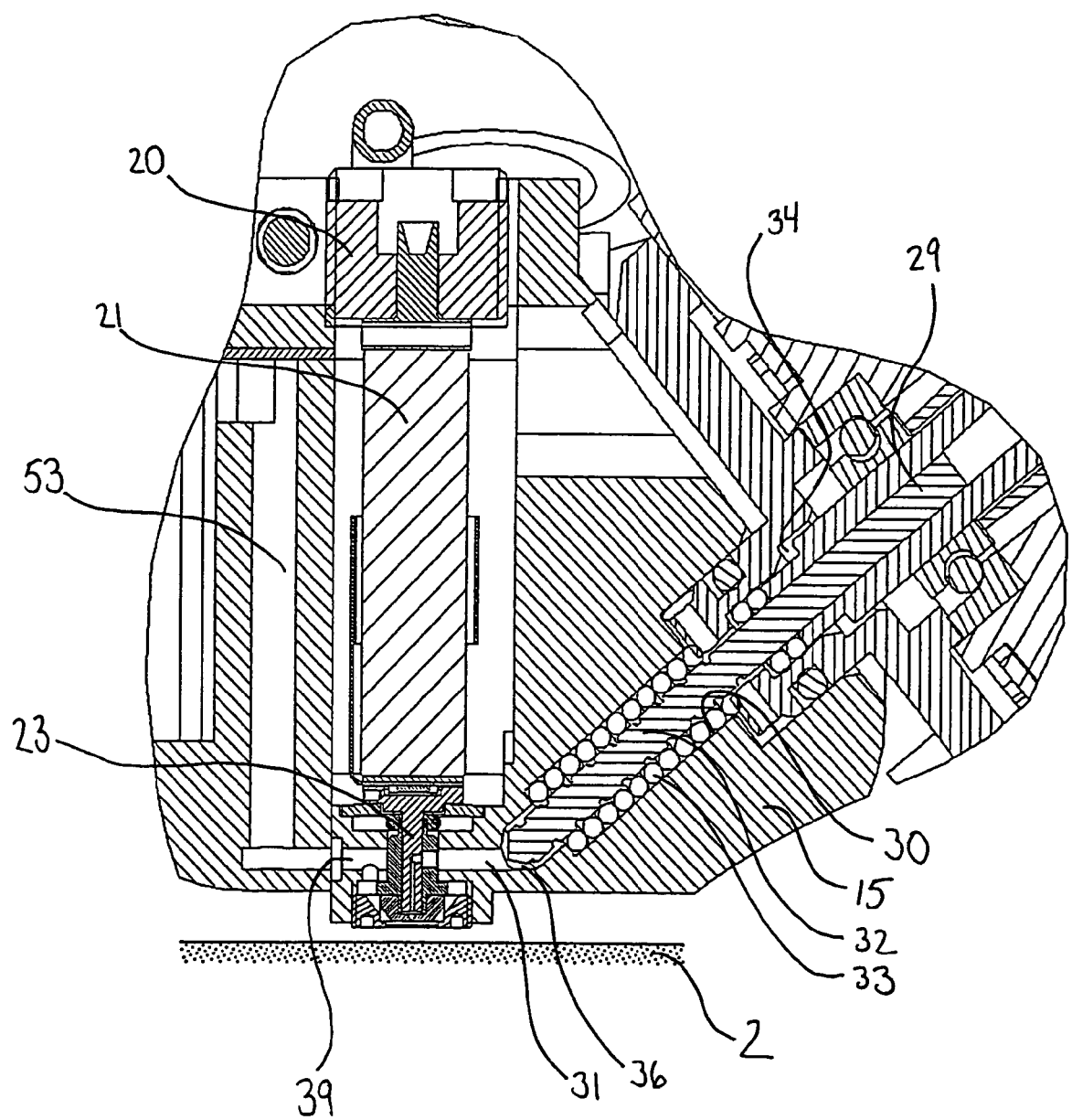
Figure 5A:
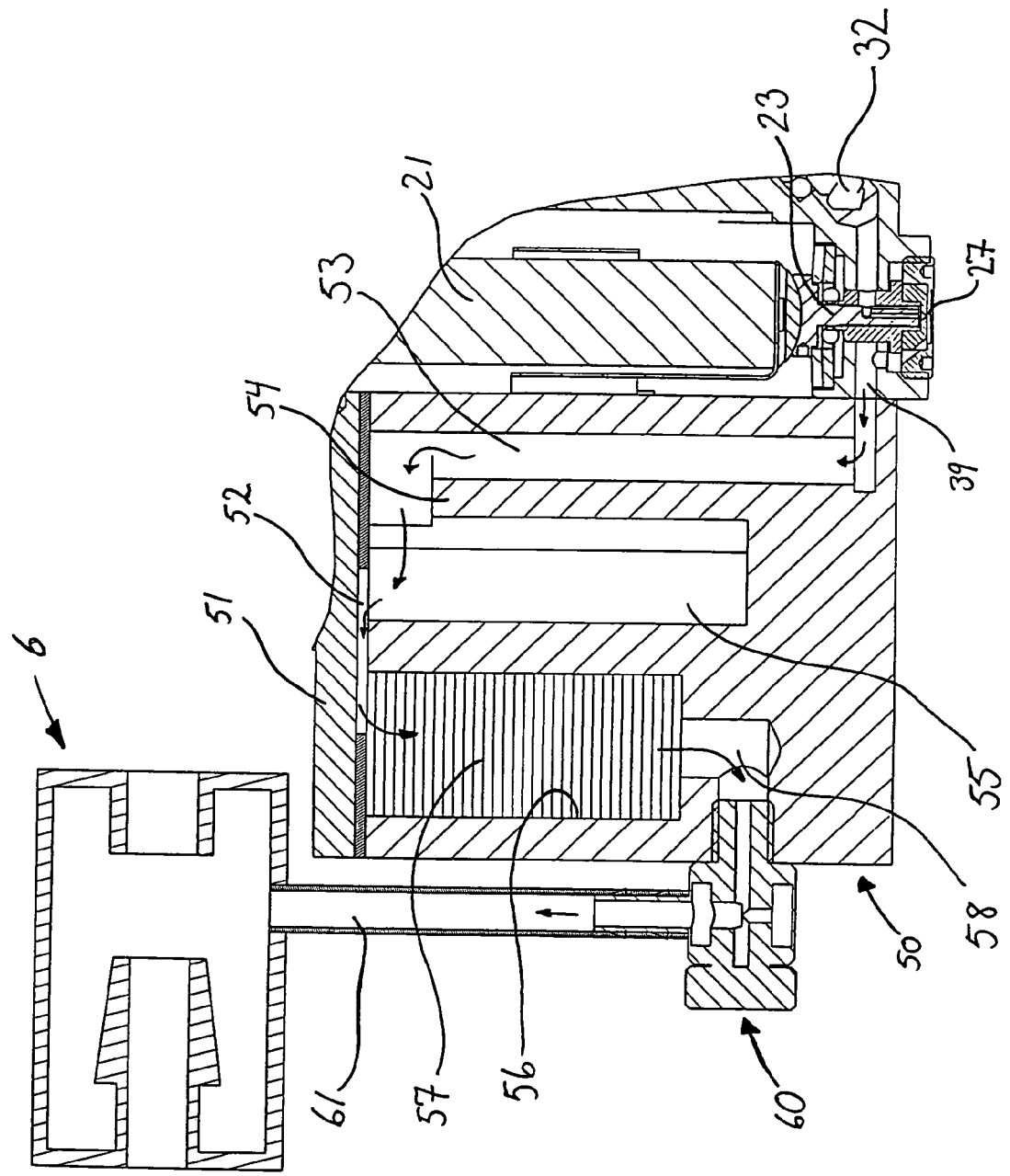
Figure 5B:
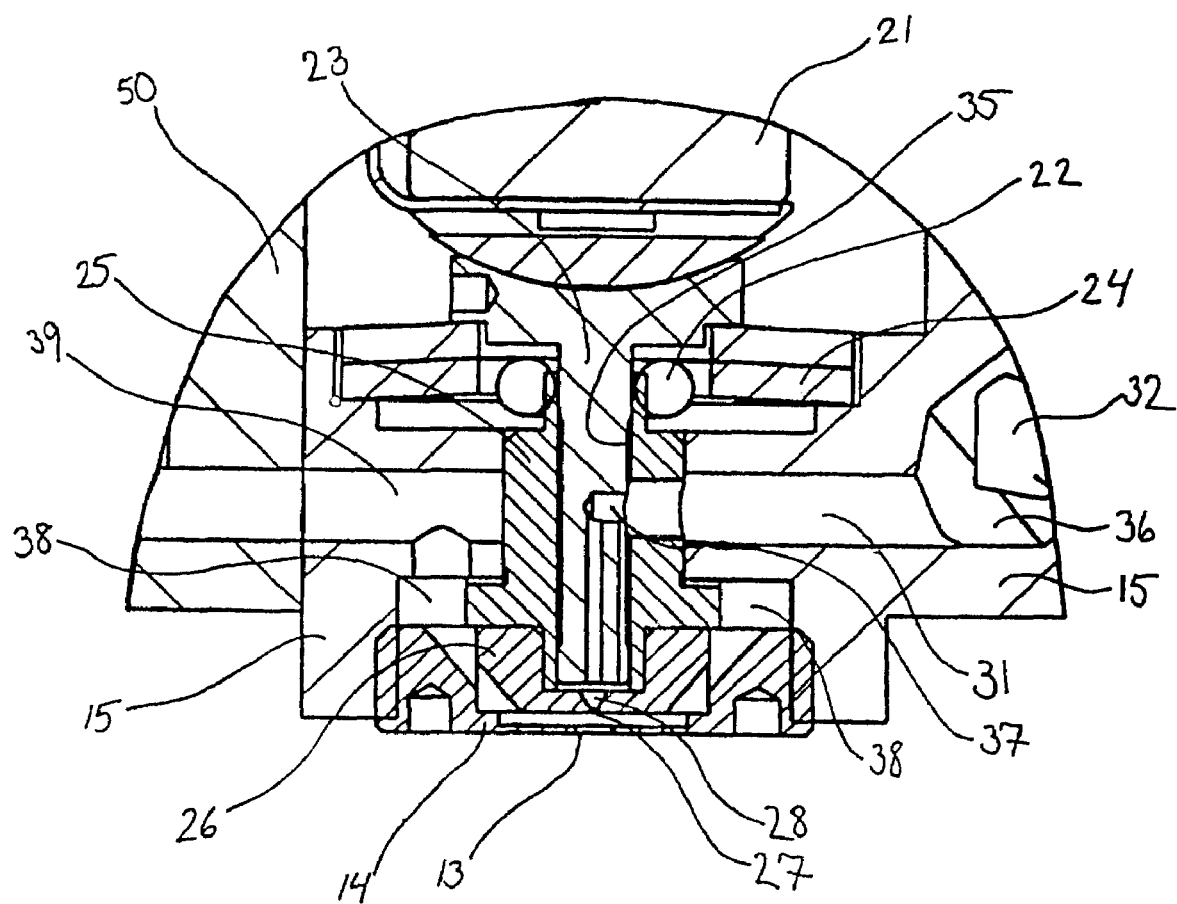
Figure 5C:
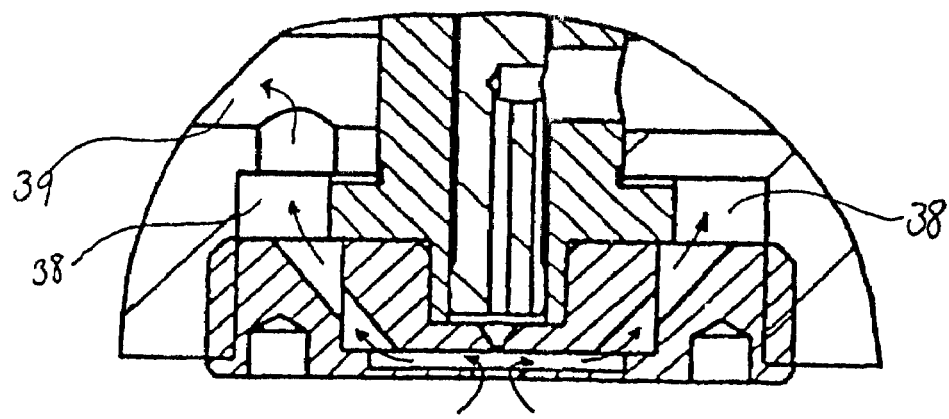

Turning now to the FIGS. 4-5c, there will be described a specific preferred embodiment of the present invention. As can most clearly be seen in FIG. 5b, the jetting device of the jetting assembly 5 comprises a support plate 14 located below or downstream of the nozzle orifice 27, as seen in the jetting direction. The support plate 14 is provided with a through hole 13, through which the jetted droplets may pass without being hindered or negatively affected by the support plate 14. Consequently, the hole 13 is concentric with the nozzle orifice 27.

According to this embodiment, the jetting assembly 5 comprises an air flow chamber 38 consisting of a first portion defined by the nozzle orifice 27, the nozzle 26 and the support plate 14, said first portion defining a disc shaped space concentric with the piston bore 35; a second portion defined by the nozzle 26 and the support plate 14, connected to said first portion and extending coaxially about the nozzle 26; and a third portion defined by the assembly housing 15 and the bushing 25, connected to the second portion, parallel with the piston bore 35 and extending coaxially around the part of the bushing 25 facing said third portion.

The air flow chamber 38 communicates with an air flow conduit 39 located on the side of the piston bore 35 opposite that of the tubular bore 31. The air flow conduit 39 comprises a first portion extending from the third portion of the air flow chamber 38 to a second portion of the air flow conduit, said first portion being parallel with the piston bore 35. Said second portion is in the form of a bore that is aligned with the conduit 31, and is arranged to provide a channel between the air flow chamber and a waste container 50 described below.

Connected to the jetting assembly 5 is a releasably mounted waste container 50, for collecting of fragments of solder paste. The waste container 50 can be best seen in FIG. 5a, where it is shown in its entirety. The waste container 50 is connected to the jetting assembly 5 at an interface on the jetting assembly 5, via a corresponding interface arranged on said waste container 50. The waste container 50, which will be described in more detail below, provides an interface and communication between the jetting assembly 5 and the vacuum ejector 6. Thereby, the negative pressure or vacuum produced by the vacuum ejector is conveyed to the jetting assembly 5, and to the communicating air flow conduit 39 and airflow chamber 38.

The waste container 50 comprises an air conduit 53, having a first portion communicating with said connecting interface and being aligned with the air flow conduit 39 of the jetting assembly, and a second portion extending perpendicularly from said first portion. The air conduit 53 communicates with a collection space 55 over a separating wall 54, the collection space being arranged for collection of solder paste residue removed from the jetting outlet.

At the top of the collection chamber 55, a narrow air conduit 52 leads the air flow from the collection chamber 55 into a filter 57. The filter 57 is of conventional type and provided for preventing any fragments of solder paste not collected in the collection chamber 55 from reaching the vacuum ejector. The filter is further provided in a longitudinal bore 56 and is in communication with an outlet conduit 58.

The waste container 50 is releasably connected to a vacuum ejector 6, of conventional type, for evacuating the waste container 50. The vacuum ejector 6 is connected to the waste container 50 via the air outlet 58, a connector 60 and an air tube 61. Even though the vacuum ejector is illustrated as being separate from the jetting assembly 5 and/or the waste container 50, a number of other placements or combinations of the vacuum ejector 6, the jetting assembly 5, and the waste container 50 are of course conceivable within the scope of the present invention.

In operation, the vacuum ejector evacuates the waste container, including evacuation of the collection space 55 the narrow air conduit 52, the longitudinal bore 56 and the filter 57, the outlet conduit 58, the connector 60 and the air tube 61. This evacuation produces an air flow through the waste container as indicated by the arrows in FIG. 5a. As a consequence, air flow conduit 38 and air flow chamber 39 of the jetting assembly 5 are also evacuated via the interface. Thus, air is sucked in through the outlet hole 13, which gives rise to a strong air flow in a direction reverse to that of the jetted droplets. This air flow will pass the jetting outlet and remove any undesired residue of solder paste that may have become adhered to the jetting outlet, for reasons described above.

According to the present embodiment of the invention, the air flow is provided before, during and after the jetting of each droplet. Also, the air flow could also be provided intermittently, following a predetermined time period of jetting, or following a predetermined number of jetted droplets. It is also contemplated that the accumulation or build-up of solder paste residue at the jetting outlet is monitored, and that the flow of air is provided when the accumulation reaches a certain level. However, it is preferred that the air flow is constantly provided during the jetting process.

The air will flow through the air flow chamber 38 and continue into the waste container 50 via the air flow conduit 39. Due to the force of the air flow, solder paste fragments removed from the vicinity of the jetting outlet will be transported or carried through the air flow chamber 38, the air flow conduit 39 and into the waste container 50. Inside the waste container 50, the air will flow through the air conduit 53, over the separating wall 54 and into the collection chamber 55. Due to the force of gravity, the majority of the solder paste residue transported by the air flow will fall into the collection chamber 55, while the air flow will continue into the narrow conduit 52. Any residue of solder paste that may continue along with the air flow into the narrow conduit 52, will be collected by the filter 57, thus preventing fragments of solder paste from reaching the outlet conduit 58.

Furthermore, as the jetted droplets face a strong head wind immediately following the jetting thereof, and droplets having a jetting trajectory with an angular deviation from that intended, will encounter a slight side wind. The effect of the side wind on a jetted droplet will be dependent of the magnitude of angular deviation. As a consequence, the angular deviation can be enhanced to such an extent that the jetted droplet will "miss" the hole 13 and instead be collected by the support plate 14. The above may also be the case for any satellites, described above, which due to their angular deviation will encounter a side wind and be collected by the support plate 14. Then, the air flow present or later produced in the air flow chamber will transport away any solder paste collected by the support plate 14. Due to the lower velocity and signifi cantly smaller volume of the satellites, as compared to the solder paste droplets, the satellites will be much more prone to be affected by the side wind.

According to an alternative embodiment of the invention, the support plate 14 comprises one or more additional holes. Then, the hole 13 arranged coaxially with the nozzle 27 is primarily used for providing a path for jetted droplets, while the other hole(s) are used for providing an inlet of air into the air flow chamber 39. Naturally, the positioning and design of the other hole(s) must be such that a forceful flow of air is provided at or past the jetting outlet.

Figure 7:
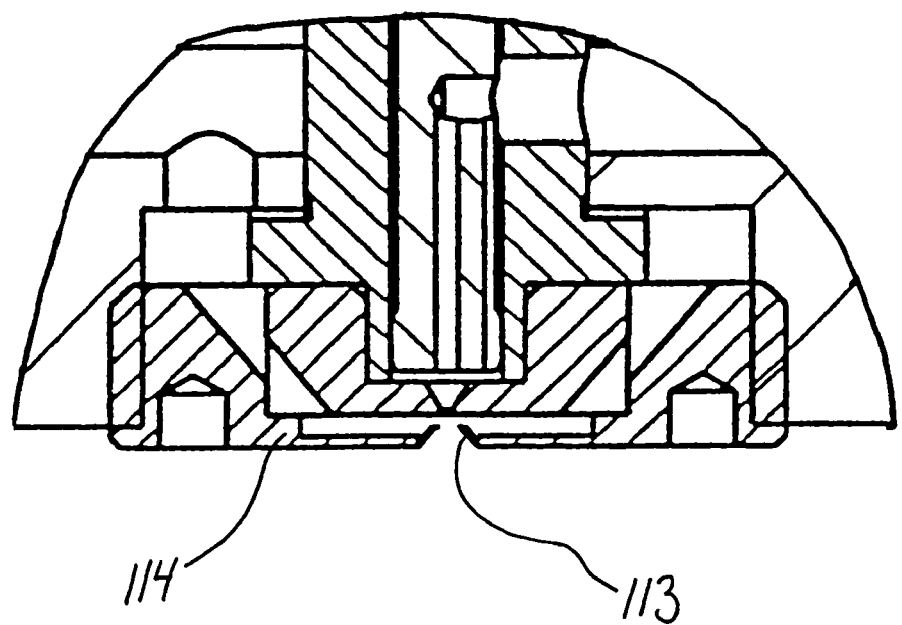

According to FIG. 7, an alternative embodiment of a support plate 114 is illustrated. In this embodiment, the wall of the support plate 114 is adjacent the hole 113 directed at an angle towards the jetting outlet. The illustrated design of the support plate 114 will provide a contraction in the flow path for the air flow, which will increase the velocity of the air flow immediately adjacent the jetting outlet. Furthermore, according to this embodiment, the inward surface of the orifice, i.e. the surface facing the viscous medium droplet as the droplet passes the orifice, is very small. This reduces the risk of viscous medium attaching to the wall surface.

As realized by the man skilled in the art, a multitude of alternative designs for narrowing the flow path at or past the jetting outlet are conceivable without departing from the scope of the present invention.

Figure 6A:
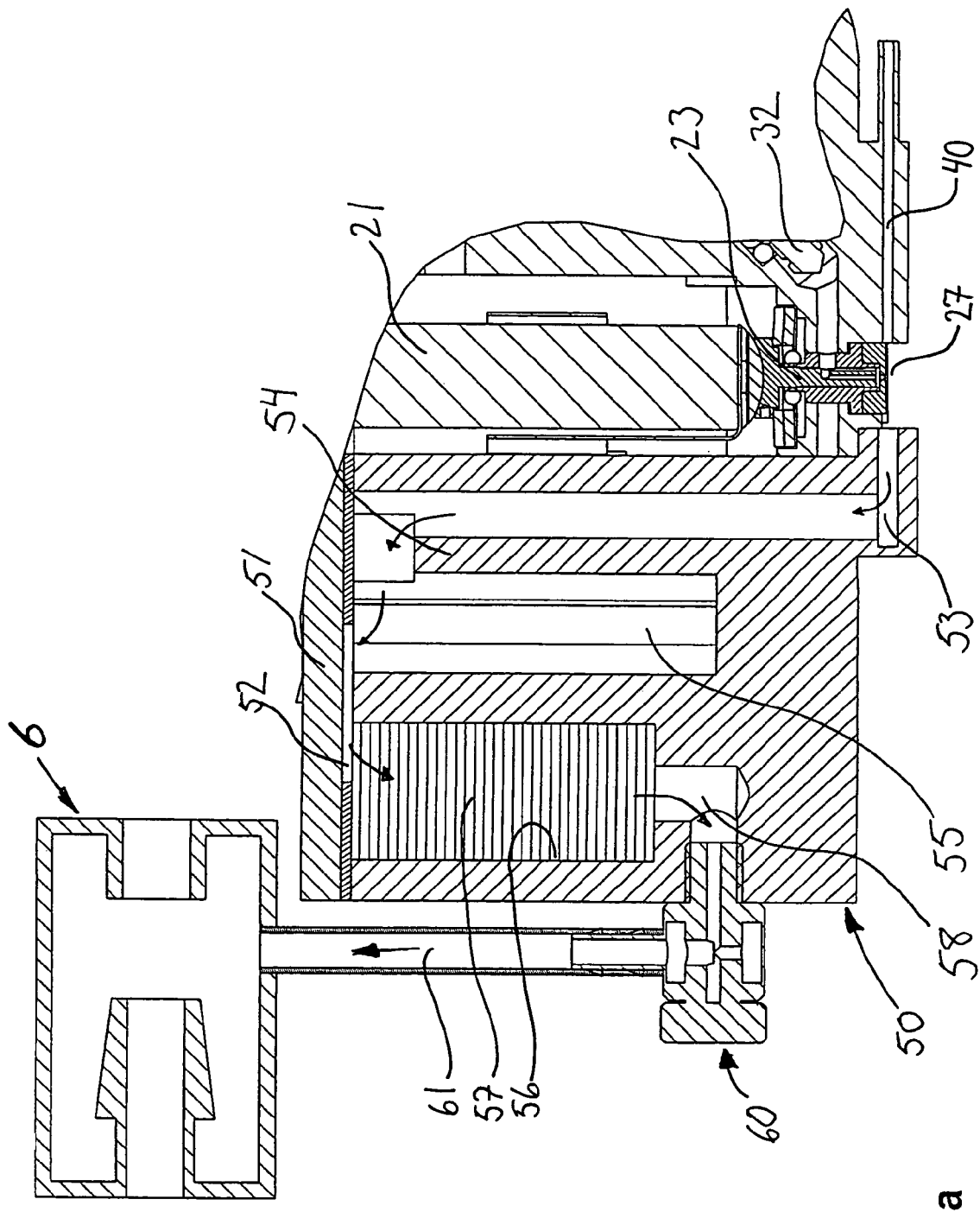
Figure 6B:
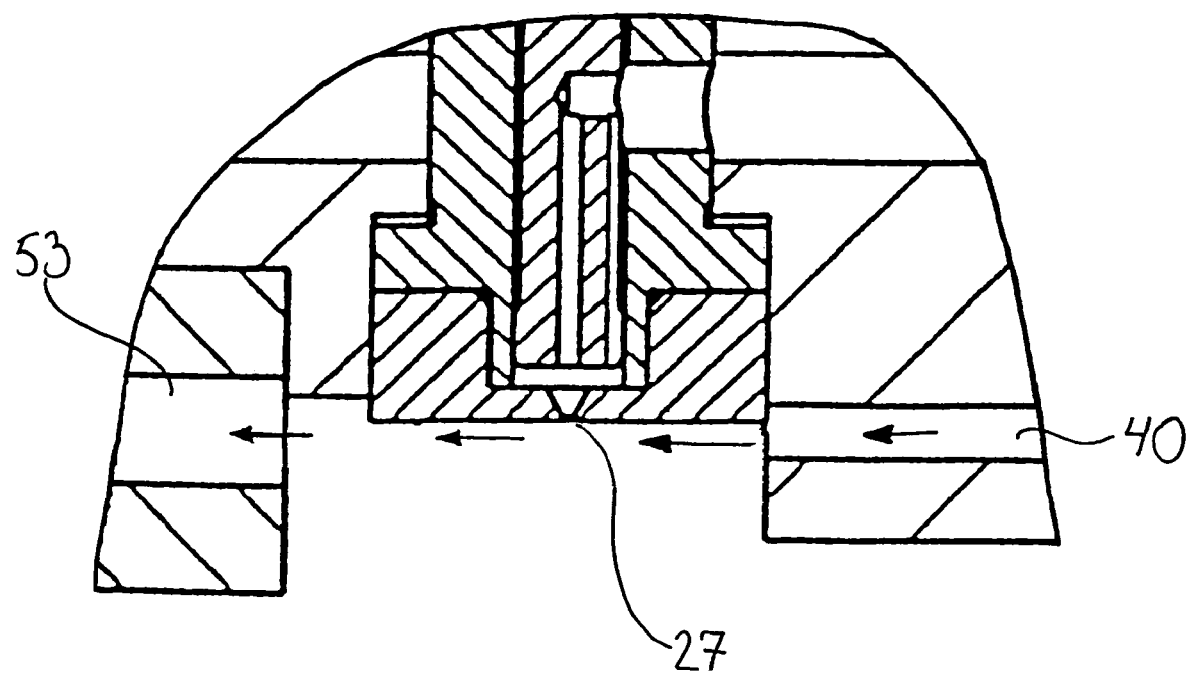

With reference now to FIGS. 6*a* and 6*b*, there is illustrated an alternative embodiment of a device according to the present invention. Since the general function of the jetting device is the same as described above, it will not be described further. According to the present embodiment, a waste container 50 and a vacuum ejector 6 is mounted to the jetting assembly 5, preferably releasably mounted. However, there is no interface between the waste container 50 and the jetting assembly 5. Instead, the air conduit 53 of the waste container 50 extends to the vicinity of the nozzle 26 and nozzle 27. The remainder of the waste container as well as the vacuum ejector are no different from that described above, and will therefore not be discussed further.

As described above, a source of pressurized air is connected to the jetting assembly 5 via a pneumatic interface, the main task for the pressurized air being described above. According to this specific embodiment, the pressurized air is also used for providing a flow of pressurized air at the jetting outlet. This is achieved by directing a flow of pressurized air from the source, through a guide (not shown), i.e. air conduits or channels, to a pressurized air outlet 40 extending to and being directed against the nozzle 27 and the jetting outlet thereof.

As can be seen in FIGS. 6*a* and 6*b*, the outlet of pressurized air 40 is located opposite the inlet 53 of the waste container 50. Thus, the blowing effect provided by the pressurized air is combined with the suction effect of the vacuum ejector 6, which will transport undesired residue of solder paste from the jetting outlet. Consequently, there will be a strong air flow across and intersecting the path of the jetted droplets, which air flow will transport undesired residue of solder paste from the jetting outlet.

Even though the present embodiment has been illustrated without a support plate, the inclusion of such a plate in this embodiment is of course conceivable within the scope of the invention. Then, the flow of air, as indicated by arrows in FIG. 6*b*, will be present in a chamber or space defined between such a support plate and the nozzle 27.

The magnitude of the air flow force will have to be controlled such that no adverse effects on the jetting trajectory of the jetted droplets results from the air flow. However, a constant minor deviation in a given direction can be compensated for by adjusting the position of the jetting assembly, i.e. the nozzle, when jetting.

Even though the present invention has been described above using exemplifying embodiments thereof, alterations, modifications, and combinations thereof, as understood by those skilled in the art, may be made without departing from the scope of the invention, which is defined in the accompanying claims. For example, the invention is not restricted to the use of a jetting assembly. On the contrary, the device and method of the present invention in a machine for jetting viscous medium without a jetting assembly are readily realized and comprised within the scope of the invention.

The invention claimed is:

1. A method of jetting droplets of viscous medium onto a substrate with a jetting device, said jetting device comprising a jetting outlet through which said droplets are jetted, comprising the steps of:

providing a gaseous flow past the jetting outlet such that an adverse effect on the performance of the jetting device that may result from accumulation of viscous medium residue at the jetting outlet is prevented, providing a wall at the jetting outlet, said wall being located downstream of the jetting outlet seen in the jetting direction, providing an orifice in said wall for permitting the jetted droplets to pass through the orifice, the orifice and the jetting outlet being aligned in the jetting direction, directing said gaseous flow after having passed the jetting outlet into a viscous medium waste compartment, and collecting in said waste compartment viscous medium transported from the jetting outlet by the gaseous flow.

2. The method according to claim 1, comprising the step of providing the orifice with such dimensions that undesired viscous medium satellites, produced during the jetting of droplets, that deviate from the general direction of the jetted droplets are collected by said wall.

3. The method according to claim 2, wherein said gaseous flow is provided such that viscous medium collected by said wall is removed from said wall by said gaseous flow.

4. The method according to claim 1, comprising the step of providing a path for the gaseous flow past the jetting outlet between said wall and said jetting outlet.

5. The method according to claim 1, comprising the step of designing said wall so that the gaseous flow adjacent the jetting outlet is focused and the velocity of the gaseous flow is increased past the jetting outlet.

6. The method according to claim 4 or 5, wherein said gaseous flow is provided through said orifice, towards the jetting outlet, and away from the jetting outlet in a radial direction along the path provided between said wall and jetting outlet.

7. The method according to claim 6, wherein said gaseous flow is provided such that a stabilizing effect on the jetting trajectory of the jetted droplets is obtained.

8. The method according to claim 1, wherein the gaseous flow at the jetting outlet is directed along a flow path that intersects the jetting path of the jetted droplets.

9. The method according to claim 8, wherein said gaseous flow sweeps along the jetting outlet.

10. The method according to claim 8 or 9, wherein said flow path is essentially perpendicular to said jetting path at the jetting outlet.

11. The method according to claim 1, wherein the gaseous flow is provided such that viscous medium residue is removed from the jetting outlet.

12. The method according to claim 1, wherein said gaseous flow is provided following the jetting of a series of jetted droplets.

13. The method according to claim 1, wherein said gaseous flow is provided following a predetermined number of jetted droplets.

14. The method according to claim 1, wherein said gaseous flow is provided following a predetermined time period during which droplets have been jetted.

15. The method according to claim 1, wherein said gaseous flow is provided such that the jetting outlet is kept free of viscous medium residue.

16. The method according to claim 15, wherein said gaseous flow is provided during the jetting of said droplets.

17. The method according to claim 1, wherein the gaseous flow is continuously provided during, between and following the jetting of droplets.

18. The method according to claim 1, wherein said gaseous flow is provided such that the presence of undesired viscous medium satellites produced during the jetting of droplets is reduced, said satellites being transported away by the gaseous flow.

19. The method according to claim 1, comprising the step of directing and focusing the gaseous flow adjacent the jetting outlet such that the velocity of the gaseous flow is increased past the jetting outlet.

20. The method according to claim 1, comprising the step of directing and focusing the gaseous flow adjacent the jetting outlet such that the ability of the gaseous flow to transport viscous medium residue from the jetting outlet is increased.

21. The method according to claim 1, comprising the step of providing a suction generator for providing said gaseous flow.

22. The method according to claim 1, comprising the step of providing a blow generator for providing said gaseous flow.

23. The method according to claim 1, comprising the step of providing a suction generator and a blow generator in combination for providing said gaseous flow.

24. The method according to claim 1, comprising the steps of: directing said gaseous flow through a filter after said gaseous flow have passed the jetting outlet, and
collecting by said filter viscous medium transported from the jetting outlet by the gaseous flow.

25. The method according to claim 1, wherein the gas used for providing said gaseous flow is air.

26. The method according to claim 1, wherein the gas used for providing said gaseous flow is nitrogen.

27. A method of jetting droplets of viscous medium onto a substrate with a jetting device, said jetting device comprising a jetting outlet through which said droplets are jetted, comprising the steps of:
jetting droplets of viscous medium onto the substrate by a non-contact dispensing process, and
providing a gaseous flow past the jetting outlet such that an adverse effect on the performance of the jetting device that may result from accumulation of viscous medium residue at the jetting outlet is prevented, wherein the gaseous flow at the jetting outlet is directed along a flow path that intersects the jetting path of the jetted droplets, said flow path being essentially perpendicular to said jetting path at the jetting outlet, wherein said gaseous flow sweeps along the jetting outlet.

28. A device for jetting droplets of viscous medium onto a substrate, said device comprising
a nozzle having a jetting outlet through which said droplets are jetted,
a flow generator for producing a gaseous flow,
a flow guide for providing a flow path for said gaseous flow past the jetting outlet, such that an adverse effect on the performance of the jetting device that may result from accumulation of viscous medium residue at the jetting outlet is prevented, wherein said flow guide comprises
a wall located at the jetting outlet, said wall being located downstream of the jetting outlet seen in the jetting direction, said wall and said nozzle defining a first space there-between, said first space being provided with an inlet and an outlet for said gaseous flow, and
a first orifice provided in said wall, said first orifice and the jetting outlet being aligned along the path of the jetted droplets, said first orifice being designed to permit jetted droplets to pass through said first orifice essentially unaffected,
wherein said flow guide is arranged to provide said gaseous flow within said first space along a flow path past the jetting outlet.

29. The device according to claim 28, wherein said wall and said jetting outlet are formed as one integral structure.

30. The device according to claim 28, wherein said inlet and said outlet are provided on opposite sides of the jetting outlet, such that said gaseous flow intersects the path of the jetted droplets.

31. The device according to claim 30, comprising a blow generator communicating with said inlet.

32. The device according to claim 28, wherein said first orifice constitutes said inlet for said gaseous flow into said first space.

33. The device according to claim 28, further comprising at least one second orifice in said wall, said second orifice constituting said inlet for said gaseous flow into said first space.

34. The device according to claim 28, wherein said flow guide comprises at least one channel running within said wall for providing a flow path within said wall for said gaseous flow.

35. The device according to claim 34, wherein said at least one channel is provided with at least one opening towards said first space at the jetting outlet, said opening constituting said inlet for said gaseous flow into said first space.

36. The device according to claim 35, wherein said at least one opening is directed at the jetting outlet.

37. The device according to claim 28, wherein the dimensions of said first orifice are such that jetted droplets are permitted to pass through said first orifice, while viscous medium satellites, produced during the jetting of droplets, that deviate from the general direction of the jetted droplets are collected by said wall.

38. The device according to claim 28, wherein said wall is arranged to narrow the flow path for the gaseous flow at the jetting outlet such that the flow velocity past the jetting outlet is increased.

39. The device according to claim 28, wherein said wall is arranged to narrow the flow path for the gaseous flow at the jetting outlet, such that the gaseous flow has an increased ability to transport viscous medium residue from the vicinity of the jetting outlet.

40. The device according to claim 38 or 39, wherein said wall is provided with at least one protrusion at said first orifice, said protrusion being directed towards the jetting outlet for providing said narrowed flow path.

41. The device according to claim 28, wherein the surface of the wall facing the substrate and surrounding the first orifice is bevelled.

42. The device according to claim 28, comprising a filter arranged downstream of said jetting outlet as seen in the direction of said gaseous flow, said filter being arranged to collect viscous medium transported by said gaseous flow.

43. The device according to claim 28, comprising a collection space arranged downstream of said jetting outlet as seen in the direction of said gaseous flow, said collection space being arranged for collecting viscous medium transported by said gaseous flow.

44. The device according to claim 28, wherein said flow generator comprises a blow generator, and wherein said flow guide is arranged for providing a flow path from said blow generator and past the jetting outlet.

45. The device according to claim 28, wherein said flow generator comprises a suction generator, and wherein said second flow guide is arranged for providing a flow path between the jetting outlet and said suction generator.

46. The device according to claim 28, wherein said flow generator comprises a suction generator and a blow generator, wherein said flow guide is arranged for providing a flow path between said blow generator and the jetting outlet, and between the jetting outlet and said suction generator.

47. The device according to claim 28, wherein the gas used for keeping the nozzle free of viscous medium residue is air.

48. The device according to claim 28, wherein the gas used for keeping the nozzle free of viscous medium residue is nitrogen.

49. A device for jetting droplets of viscous medium onto a substrate, said device comprising:
- a nozzle having a jetting outlet through which said droplets are jetted using a non-contact dispensing process,
- a flow generator for producing a gaseous flow,
- a flow guide for providing a flow path for said gaseous flow past the jetting outlet such that an adverse effect on the performance of the jetting device that may result from accumulation of viscous medium residue at the jetting outlet is prevented, said flow guide being arranged for providing said flow path in a direction that intersects the jetting path of the jetted droplets, said flow guide being arranged for directing said gaseous flow essentially perpendicular to said jetting path at the jetting outlet, wherein said flow guide is arranged for directing said gaseous flow along the jetting outlet.

* * * * *